United States Patent [19]

Sato

[11] Patent Number: 4,784,926

[45] Date of Patent: Nov. 15, 1988

[54] CONSTRUCTION OF BATTERY COMPARTMENT

[75] Inventor: Takao Sato, Tokyo, Japan

[73] Assignee: Kabushiki Kaisha Toshiba, Kawasaki, Japan

[21] Appl. No.: 94,759

[22] Filed: Sep. 10, 1987

[30] Foreign Application Priority Data

Feb. 26, 1987 [JP] Japan .................................. 62-43297

[51] Int. Cl.$^4$ ............................................. H01M 2/10
[52] U.S. Cl. ........................................ 429/96; 429/98
[58] Field of Search ................................... 429/96–100

[56] References Cited

U.S. PATENT DOCUMENTS 4,430,009 2/1984 Muller .............................. 429/98 X
4,692,846 9/1987 Johnson ............................ 429/97 X

OTHER PUBLICATIONS

"64 KB IC Card Operation Manual, by Hattori Seiko Co., Ltd., Jan. 1986.
Maxell Memory Cartridge Catalogue, by Hitachi Maxell Co., Ltd., Sep. 1986.

*Primary Examiner*—Anthony Skapars
*Attorney, Agent, or Firm*—Foley & Lardner, Schwartz, Jeffery, Schwaab, Mack, Blumenthal & Evans

[57] ABSTRACT

A battery compartment of a thin type device such as a memory card which must house a battery therein. The construction comprises a pair of inlet wall surfaces which are extended inwardly through one side wall of the main body of the thin type device and which are inclined at a predetermined angle to the outer surface of the one side wall of the main body; a compartment surface whose both ends merge with the pair of inlet wall surfaces, respectively, and which has a shape for snuggling a battery thereto; a cover body which is inserted into the battery compartment space defined by the pair of wall surfaces and the compartment surface while holding a battery; and a locking device for securely attaching the cover body to the main body. The side surfaces of the cover body are so inclined that they can match to the pair of inlet wall surfaces, respectively. Thus the cover body can be inserted into or withdrawn out of the main body only in the direction of inclination. As a result, the cover body can be securely attached to the main body and there is no fear that the cover body may be dropped out of the main body.

6 Claims, 2 Drawing Sheets

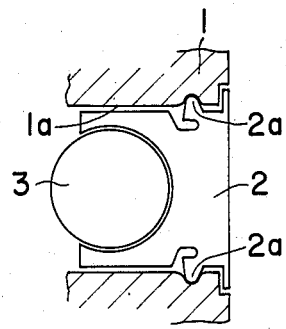
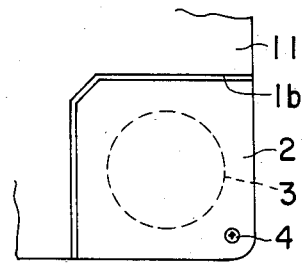
FIG. 1
PRIOR ART
FIG. 2
PRIOR ART
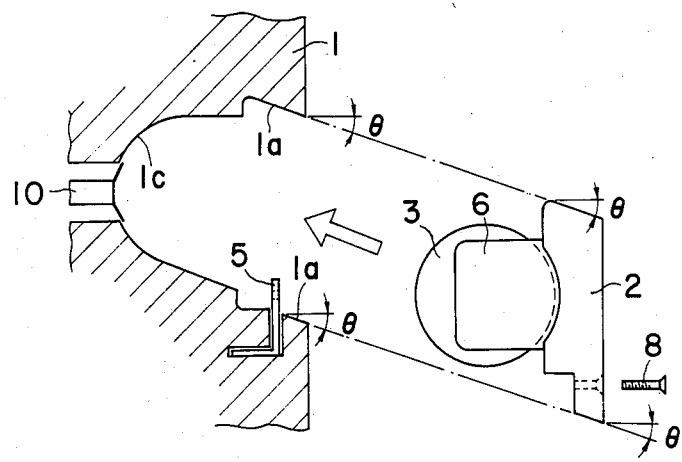
FIG. 3

CONSTRUCTION OF BATTERY COMPARTMENT

BACKGROUND OF THE INVENTION

The present invention relates to a construction of a battery compartment and, more particularly, to a construction of a battery compartment in a thin device such as a memory card which requires battery exchange.

Memory cards, thin type radio sets and the like are in general very thin in thickness of the order of less than 3 mm. Therefore, in these thin card-type-devices, battery compartments having the constructions as shown in FIG. 1 and FIG. 2 have been generally used in order to make it easy to exchange a battery such as a coin-shaped lithium battery CR2016 or the like.

More particularly, in the case of the battery compartment as shown in FIG. 1, a battery insertion opening 1a is extended through one side wall of main body 1 of a memory card or the like substantially perpendicular to the side wall. A cover 2 having a battery 3 clamped at the leading end therof is inserted into the opening 1a and is securely attached to the main body 1 under the elastic forces of clicks 2a protruding outwardly from both sides of the cover 2. Therefore, when the cover 2 is drawn from the opening 1a and inserted again into the opening 1a of the main body 1, an old battery can be replaced with a new battery without use of any special device.

In the case of the battery compartment of the type shown in FIG. 2, an opening 1b is formed through the upper or bottom wall 11 of a main body of a memory card or the like. A cover 2 which constitutes a part of the top or bottom wall is removed by loosening screw 4 to open the opening 1b to remove an old battery and then a new battery is inserted into the opening 1b. Thereafter the opening 1b is closed by the cover 2 and the cover 2 is securely held in position by tightening the screw 4.

However, in the case of the battery compartment of the type described above with reference to FIG. 1, the exchange of a discharged battery for a new battery is easy because no special tool or the like is needed to securely hold the cover 2 in position, but there is a problem that the cover 2 tends to be opened erroneously. In the case of a memory card, such an accident causes a fatal problem because of an electric power supply or the battery 3 is electrically disconnected from its associated electronic circuits or the like in the main body 1 so that the data stored in the memory card is lost. In addition, the cover 2 together with its click portions 2a is fabricated by molded plastic so that the elasticity of the clicks 2a becomes different from one cover to another because of the slight difference in shape or configuration between the covers so that the clicking forces of the clicks 2a become different from each other. Furthermore, there is a fear that the cover 2 may break because of the decrease in mechanical strength due to aging.

In the case of the battery compartment as shown in FIG. 2, the opening 1b is formed through the upper or bottom wall of the memory card or the like and a discharged battery is replaced with a new one through this opening 1b so that the withdrawal and insertion of the batteries can be easily carried out. However, the design of the main body of the device is considerably limited because of a poor outer appearance of the cover 2.

SUMMARY OF THE INVENTION

In view of the above, one of the objects of the present invention is to provide a construction of a battery compartment in which a cover can be easily and securely held in position and a battery can be withdrawn or inserted through one side wall of a main body of a memory card or the like so as not to degrade the outer appearance of the main body.

To the above and other ends, in a battery compartment adapted for use in a device or equipment housing a battery therein, the present invention provides a pair of inlet wall surfaces continuously formed with one of the side walls of the main body of the device or equipment inclined at a predetermined angle relative to the surface of said one side wall, a compartment wall surface which has a mating surface adapted to mate with an inserted battery and whose ends merge with the inner ends of said pair of inlet walls, a cover body which has side surfaces so inclined as to snugly mate with the pair of inlet walls and which is inserted into a battery compartment defined by the inlet side surfaces, and means for securely attaching the cover body to the main body of the device or equipment.

BRIEF DESCRIPTION OF THE DRAWINGS

In the accompanying drawings:

FIG. 1 is a fragmentary sectional view of a memory card illustrating a conventional battery compartment construction where a battery can be withdrawn or inserted through one side wall of the main body;

FIG. 2 is a fragmentary bottom view of a memory card illustrating a conventional battery compartment construction where a battery can be inserted or withdrawn through the bottom wall of the main body;

FIGS. 3 to 5 are fragmentary sectional views, respectively, of a memory card having a battery compartment in accordance with the present invention, wherein FIG. 3 is an exploded sectional view illustrating the construction of a battery compartment prior to the insertion of a cover body;

FIG. 4 is a fragmentary sectional view illustrating the cover body securely attached to the memory card; and FIG. 5 is a longitudinal sectional view illustrating the battery compartment after the cover body is securely attached to the memory card.

DESCRIPTION OF THE PREFERRED EMBODIMENTS

Figure 4:
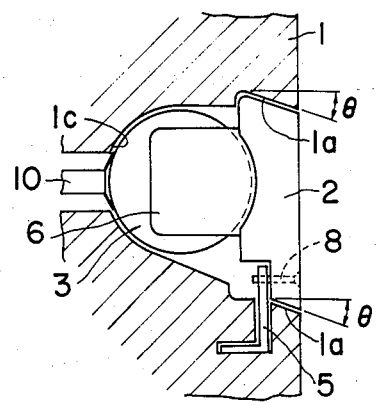
Figure 5:
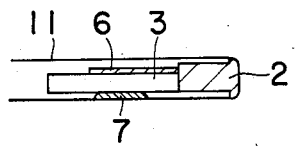

Referring now to FIGS. 3 to 5, a first preferred embodiment of the present invention will be described. Even though the first embodiment will be described in detail in conjunction with a memory card, it is to be understood that the present invention may be equally applied to any device or equipment such as a thin type radio, a desk-top computer, a clock, a wrist watch and so on in which it is required to replace a discharged battery with a new one.

A pair of inlet wall surfaces 1a are continuously formed with one side wall of the main body 1 of the memory card in such a way that they are inclined at an angle $\theta$ (15° in the first embodiment) with respect to normal relative to the surface of the one side wall of the main body 1 and are in opposing and parallel relationship with each other. A locking member 5 which is embedded in one of the pair of inlet walls 1a is extended upright.

A cover body 2, which can be detachably inserted between the pair of inlet walls 1a so as to place a battery 3 in contact with a compartment wall 1c of the main body 1, has the side surfaces inclined at the same angle θ. Therefore, when the cover body 2 is pushed or pulled in the direction inclined by the angle θ with respect to normal relative to the outer surface of the one side wall of the main body 1, it can be inserted into or withdrawn out of the main body 1, but when the cover body 2 is pushed or pulled in any other direction, it cannot be inserted or withdrawn.

The cover body 2 is molded together with a thin metal plate 6 and when the coin-shaped lithium battery 3 is attached to the undersurface of the thin plate 6 which also serves as a guide and when the cover body 2 is inserted between the pair of inlet walls 1a, the battery 3 can be securely placed in a predetermined position. In addition, the inserted battery 3 is clamped between the thin plate 6 and an first electrode 7 (FIG. 5) of the main body and also makes a contact with an inner second electrode 10 so that the battery 3 supplies the electric energy to the circuits within the main body 1.

In the first embodiment described above, the thin plate 6 has a function of guiding the battery 3, but has not been used as an electrode. However, it may be used as an electrode.

A tap screw 8, for instance 1.4 mm in diameter, is inserted into a screw through-hole of the cover body 2 and is threadably engaged with a screw hole, for instance 1.2 mm in diameter, formed in the locking member 5, whereby the cover body 2 can be securely attached to the mainl body 1. As described above, the inlet side walls 1a and the side surfaces of the cover body 2 are inclined at the same angle θ so that there is no fear that the cover body 2 may be pulled out of the main body 1 in the direction perpendicular to the outer surface of the one side wall thereof. As a result, the cover body 2 can be securely attached to the main body 1 by jointing between them only at one position.

It is to be understood that the present invention is not limited to the tap screw 8 and that instead a conventional pin can be used while the locking member 5 has a tapped hole.

Figure 6:
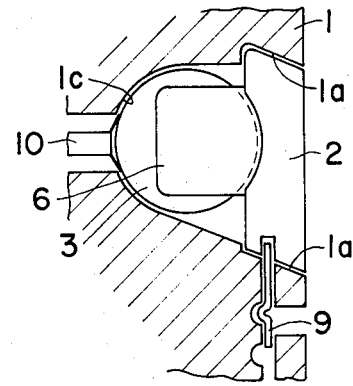
FIG. 6 is a fragmentary sectional view of a memory card illustrating another embodiment of a construction of a battery compartment closed with a cover body.

Referring next to FIG. 6, a second preferred embodiment of the present invention will be described. In the second embodiment, a pin 9 is slidably fitted into the main body 1 so that the upper end portion thereof can be fitted into a recess formed in one of the side surfaces of the cover body 2 when the cover body 2 is attached to the main body 1, whereby the cover body 2 can securely held in position within the main body 1.

In the case of the second preferred embodiment with the above-described construction, the cover body 2 can be securely attached to the main body 1 only by sliding the pin 9, but in one modification of the present invention, the cover body 2 may be provided with clicks so that the cover body 2 can be securely held in position in the main body 2 under the elastic forces of such clicks. In this case, the cover body 2 can be attached to the main body 1 by one step.

As described above, the battery compartments need not have moving members such as click springs so that the battery compartment constructions are very rigid from the standpoint of the structure. Furthermore, the cover body can be securely attached to the main body and it can be prevented from being detached from the main body.

Furthermore, according to the present invention, the cover body is inserted into or withdrawn out of the main body of, for instance, the memory card through one of its side walls so that the outer appearance is not odd and that the construction of the battery compartment is not adversely affected from the standpoint of the design.

What is claimed is:

1. In a device which requires battery replacement, the improvement comprising:
   a main body having a side wall;
   a battery compartment formed in the said side wall, said battery compartment having an associated locking member, a battery receiving portion and a pair of opposed inlet walls, said inlet walls being at an angle $\theta$, said angle being inclined with respect to normal, relative to said side wall; and
   a cover body having a battery receiving portion, a pair of opposed sides inclined at said angle for mating engagement with said inlet walls and means for attachment with said locking member.

2. The device as set forth in claim 1, wherein said cover body has a thin plate for supporting a battery thereon.

3. The device as set forth in claim 2, wherein an electrode to make an electrical contact with said battery is disposed in said cover body.

4. The device as set forth in claim 2, wherein said thin plate is an electrode for establishing an electrical contact with said battery.

5. The device as set forth in claim 1 wherein said locking member is securely attached to the main body of said device and a screw is carried by said cover body for threadable engagement with a screw hole in said locking member, whereby said cover body can be securely attached to the main body of said device.

6. The device is set forth in claim 1, wherein said locking member comprises a pin slidably fitted in said main body of said device and a recess is formed in said cover body for receiving said pin.

* * * * *